(12) United States Patent
Maunand Tussot et al.

(10) Patent No.: US 7,645,392 B2
(45) Date of Patent: Jan. 12, 2010

(54) METHODS FOR PREPARING A BONDING SURFACE OF A SEMICONDUCTOR WAFER

(75) Inventors: Corinne Maunand Tussot, Meylan (FR); Christophe Maleville, La Terrasse (FR); Hubert Moriceau, Saint Egreve (FR); Alain Soubie, Saint Egreve (FR)

(73) Assignees: S.O.I.Tec Silicon on Insulator Technologies, Bernin (FR); Commissariat a l'Energie Atomique (CEA), Paris (FR)

( * ) Notice: Subject to any disclaimer, the term of this patent is extended or adjusted under 35 U.S.C. 154(b) by 750 days.

(21) Appl. No.: 11/472,665

(22) Filed: Jun. 21, 2006

(65) Prior Publication Data
US 2006/0273068 A1 Dec. 7, 2006

Related U.S. Application Data

(63) Continuation of application No. PCT/IB2005/001064, filed on Mar. 30, 2005, and a continuation-in-part of application No. 10/875,233, filed on Jun. 25, 2004, now abandoned.

(30) Foreign Application Priority Data
Mar. 30, 2004 (FR) .................................. 04 03273

(51) Int. Cl.
*B44C 1/22* (2006.01)
(52) U.S. Cl. ..................... 216/33; 216/83; 257/E21.568
(58) Field of Classification Search ........................ None
See application file for complete search history.

(56) References Cited
U.S. PATENT DOCUMENTS

| 5,543,648 A | 8/1996 | Miyawaki | 257/347 |
| 6,048,411 A | 4/2000 | Henley et al. | 148/33.5 |
| 6,312,797 B1 | 11/2001 | Yokokawa et al. | 428/336 |

(Continued)

FOREIGN PATENT DOCUMENTS

EP 0 828 289 A1 3/1998

(Continued)

OTHER PUBLICATIONS

Riley et al., The Impact of Temperature and Concentration on SC2 Cost and Performance in a Production Environment, Mat. Res. Soc. Symp. Proc. vol. 77, 519 (1997).*

(Continued)

*Primary Examiner*—Allan Olsen
(74) *Attorney, Agent, or Firm*—Winston & Strawn LLP

(57) ABSTRACT

A method for preparing an oxidized surface of a first wafer for bonding with a second wafer. The method includes treating the oxidized surface with a solution of $NH_4OH/H_2O_2$ at treatment parameters sufficient to etch about 10 Å to about 120 Å from the wafer surface, followed by treating the etched surface with hydrochloric acid species at a temperature below about 50° C. for a duration of less than about 10 minutes to remove isolated particles from the oxidized surface. This method cleans the wafer surface without increasing roughness or creating rough patches thereon, and thus provides a cleaned surface capable of providing an increased bonding energy between the first and second wafers when those surfaces are bonded together. This cleaning process is advantageously used in a thin layer removal process to fabricate a semiconductor on insulator structure.

20 Claims, 3 Drawing Sheets

U.S. PATENT DOCUMENTS

| | | |
|---|---|---|
| 6,613,678 B1 | 9/2003 | Sakaguchi et al. .......... 438/695 |
| 2003/0153162 A1 | 8/2003 | Nakano et al. .............. 438/458 |
| 2004/0103919 A1* | 6/2004 | Kenny et al. ................. 134/19 |
| 2005/0218111 A1* | 10/2005 | Maleville et al. .............. 216/33 |
| 2006/0014366 A1* | 1/2006 | Currie ........................ 438/517 |
| 2006/0141746 A1* | 6/2006 | Delattre et al. ............. 438/455 |
| 2006/0186510 A1* | 8/2006 | Lochtefeld et al. .......... 257/565 |
| 2006/0197123 A1* | 9/2006 | Lochtefeld et al. .......... 257/288 |
| 2006/0197124 A1* | 9/2006 | Lochtefeld et al. .......... 257/288 |
| 2006/0197125 A1* | 9/2006 | Langdo et al. .............. 257/288 |
| 2006/0197126 A1* | 9/2006 | Lochtefeld et al. .......... 257/288 |
| 2006/0273068 A1* | 12/2006 | Maunand Tussot et al. ... 216/33 |
| 2007/0087526 A1* | 4/2007 | Chhaimi et al. ............. 438/455 |
| 2008/0014714 A1* | 1/2008 | Bourdelle et al. ........... 438/455 |
| 2008/0128751 A1* | 6/2008 | Langdo et al. .............. 257/191 |

FOREIGN PATENT DOCUMENTS

| | | |
|---|---|---|
| EP | 0 961 312 A2 | 12/1999 |
| EP | 0 971 396 A1 | 1/2000 |
| EP | 1 065 708 A2 | 1/2001 |
| EP | 0 690 483 B1 | 2/2003 |
| EP | 1 302 985 A1 | 4/2003 |
| EP | 0 701 275 B1 | 11/2003 |
| FR | 2 794 891 | 12/2000 |

OTHER PUBLICATIONS

Colinge, J. P., "Silicon-On-Insulator Technology", Materials to VLSI, 2nd Edition, pp. 50-51 (1997).

Maleville, Christopher et al., "Wafer Bonding and H-Implantation Mechanisms Involved in the Smart-Cut Techology", Elsevier Science S.A., Materials Science and Engineering, vol. B46, pp. 14-19 (1997).

Maleville, Christopher et al., "Detailed Characterization of Wafer Bonding Mechanisms", Electromechanical Society Proceedings, vol. 97-36, pp. 47-55, (1997).

E.V. Astrova et al., XP 000417397, "Effect of Chemical Surface Treatment On P-Layer Formation In The Interface Region of Directly Bonded Si Wafers" Semiconductor. Science and Techology. vol. 8, No. 9, pp. 1700-1705 (1993).

Q.-Y Tong and U. Gosele, "Semiconductor Wafer Bonding" (1999), John Wiley & Sons, pp. 10-12 and 51-53.

* cited by examiner

METHODS FOR PREPARING A BONDING SURFACE OF A SEMICONDUCTOR WAFER

CROSS-REFERENCE TO RELATED APPLICATIONS

This application is a continuation of International application no. PCT/IB2005/001064 filed Mar. 30, 2005 and a continuation-in-part of application Ser. No. 10/875,233 filed Jun. 25, 2004, now abandoned the entire content of each of which is expressly incorporated herein by reference thereto.

BACKGROUND ART

The present invention generally relates to the bonding of two semiconductor wafers suitable for use in or the production of structures for micro-electronics, optics, or optronics applications. In particular, the invention relates to preparing an oxidized bonding surface of at least one of the wafers, wherein treatment parameters are chosen to provide etching that is sufficient to remove isolated particles from the oxidized surface but that is sufficiently weak to smooth the surface without creating rough patches thereon.

In order to ensure good contacting quality before bonding two wafers together, at least one and preferably both of the two surfaces to be bonded are cleaned to remove isolated particles or contaminants on wafer surfaces which are prejudicial to good bonding when located at the interface of two wafers. This is particularly the case when atomic species are implanted through an oxidized surface of a wafer to form a weakened area therein at a pre-set depth beneath the oxidized surface and to create a thin layer or film on the wafer surface. This thin layer is detached from the implanted wafer after it has been bonded to another substrate. An example of such a detachment process is the SMART-CUT® process, which is known to skilled person in the art (see "Silicon-on-Insulator Technology. Materials to VLSI", 2nd edition, by Jean-Pierre Colinge, published by Kluwer Academic Publishers, pages 50 and 51), and which allows a film to be removed from a wafer for transfer to another wafer. A semiconductor-on-insulator structure such as an SOI (Silicon On insulator) structure can be made in this manner by transferring a thin silicon film from a donor wafer to a receiver wafer.

With the increase of miniaturization of electronic components formed in semiconductor layers, manufacturers of semiconductor-on-insulator substrates are increasingly asked to make semiconductor-on-insulator structures that include thinner and thinner semiconductor films. Thus, it is vitally important to improve the quality of a transferred layer and therefore to improve removal techniques. Consequently, the quality of the bond between the layer to be transferred and the receiver substrate is essential in order to ensure good removal, wherein the quality of the bond is mainly measured by the bonding energy between the two wafers. To ensure that the contact area of the two wafers to be joined is of good quality, it is necessary to implement a cleaning operation to clean at least one of the two bonding surfaces.

Cleaning is conducted to remove those particles which are enclosed in the bonding interface and which can lead to superficial blisters being formed in the structure obtained after detachment or to portions of the wafer that were not transferred between the zone at which the species were implanted and the surface of the structure. Such blisters can multiply or grow during a heat treatment, such as that conducted during or after bonding to strengthen the bond. Thus, it is important to find a means for removing such particles and contaminants from bonding surfaces.

A trend in the prior art is to chemically treat the wafers in stages prior to bonding. To clean the surface of a wafer of oxidized or non-oxidized semi-conductor material, the known technique is to use a treatment called RCA. The RCA treatment includes a first bath of Standard Clean 1(SC1) solution that includes ammonium hydroxide ($NH_4OH$), hydrogen peroxide ($H_2O_2$) and deionised water, generally at a temperature of between 30° C. and 80° C., and then a second bath of Standard Clean 2 (SC2) solution, which contains hydrochloric acid (HCl), and hydrogen peroxide ($H_2O_2$), and deionised water, generally at a temperature of between 70° C. and 90° C. The first bath is intended mainly for removing isolated particles on the wafer surface and for removing particles buried in the vicinity of the surface and to prevent them from resettling. Further, that first SC1 dip can improve the hydrophilicity of the surface of the wafer to be bonded, and is used because the hydrophilic property of the surface constitutes an essential condition for good bonding between the wafers. The SC2 solution mainly removes any metallic contamination that has settled on the wafer surface, in particular, by forming chlorides.

The metal removal efficiency of the SC2 solution is typically between 95% and 99% at temperatures between ambient and 90° C. The depth of chemical action into the wafer is typically from about 1 angströms (Å) to about 10 Å at these temperatures. For this reason, the SC2 treatment is usually employed at temperatures in the range 70° C. to 90° C.

Even after implementing such chemical treatments, however, the resulting surfaces have roughness or rough patches, which can, in some cases, be more significant than that existing prior to treatment due to the attack of the surface by the cleaning solutions. Such roughness or rough patches on the surface of the wafers alter the bonding energy of the wafers because they have a relatively high Root Mean Square (RMS) value, measured in angströms. The presence of isolated particles or contaminants on the surface of the wafers can also be detrimental to good bonding of the wafers when these contaminants are found at its interface. After bonding, these particles which are enclosed at the bonding interface, may cause surface blisters to form in the structure obtained after using a SMART-CUT® detachment technique, and/or cause surface blisters in areas not transferred between the area at the level of which the species were implanted and the surface of the structure. These blisters increase in size and/or grow during any subsequent heat treatment, for example, a heat treatment used after bonding to strengthen the bond.

One known solution for increasing separation of the isolated particles is to conduct the chemical treatment while applying ultrasonic waves. These waves cause the isolated particles to vibrate and therefore to separate off. It is preferable, however, to avoid implementing an additional process when cleaning the wafers to avoid complicating the cleaning stage. Furthermore, additional equipment would be required in order to generate the ultrasonic waves.

European patent application 0 971 396 suggests a cleaning technique consisting of preparing a such implanted surface by implementing three cleaning steps, an SC1 treatment, followed by an SC2 treatment, and finally followed by another SC1 treatment. The three steps of this process have a total duration of SC1 treatment of about 8 minutes (2×4 minutes) at 80° C., and of SC2 treatment of about 4 minutes at 80° C. This does not resolve the problems of the art and thus there still remains a need for techniques that provide improvements in the bond quality between joined wafers. It is therefore necessary to carry out an RCA treatment that is adapted to optimize both cleaning and bonding actions. Such a treatment is now provided by the present invention.

SUMMARY OF THE INVENTION

The invention relates to a method for preparing a oxidized surface of a first wafer for enhanced molecular bonding with a second wafer. This method comprises treating the oxidized surface of the first wafer with a solution of $NH_4OH/H_2O_2$ at treatment parameters sufficient to etch about 10 Å to about 120 Å from the wafer surface, followed by treating the etched surface with hydrochloric acid species at a temperature below about 50° C. for a duration of less than about 10 minutes to remove isolated particles from the oxidized surface. This method cleans the wafer surface without increasing roughness or creating rough patches thereon, and thus provides a cleaned surface capable of providing an increased bonding energy between the first and second wafers when those surfaces are bonded together compared to bonding of those surfaces without such treating of the oxidized surface of the first wafer.

In one embodiment, the treatment parameters of the method include at least one of a predetermined dose of chemical elements, a predetermined temperature, or a predetermined duration for applying the treatment. These treatment parameters are advantageously chosen such that treating removes isolated surface particles having an average diameter of more than about 0.1 micrometers. In a beneficial implementation, the treatment parameters are chosen such that after treatment any rough patches that appear are less than about 5 Å RMS. In a variation, the treatment parameters are chosen such that after treatment any rough patches that appear are less than about 4 Å RMS.

Advantageously, the etching is conducted to remove a depth of about 10 Å to about 60 Å from the first wafer surface. Advantageous treatment parameters include a dose per unit mass of $NH_4OH/H_2O_2$ in the range from about 1/2.5 to about 1/1, a temperature of between about 30° C. and about 90° C. and a duration of between about 1 and 6 minutes. Preferred treatment parameters include dose per unit mass of $NH_4OH/H_2O_2$ of about 1/2.5 to about 1/2, a temperature of about 50° C. to 70° C., and a duration of about 3 minutes, or even a dose per unit mass of $NH_4OH/H_2O_2$ of about 3/4, a temperature of about 80° C., and a duration of about 3 minutes. If desired, a plasma activation of the first wafer surface can be conducted prior to the treating with the $NH_4OH/H_2O_2$ solution.

The hydrochloric acid treating is conducted in a wet or dry manner and is carried out to remove about 95% to 99% of metallic contaminants from the wafer surface. The hydrochloric acid species is generally applied to the wafer surface at a temperature that is no greater than about room temperature but that is greater than about 0° C.

For optimum bonding properties, the surface of the second wafer is treated in the same manner as that of the first wafer. This provides a further increase of the bonding energy between the wafers when those surfaces are bonded together.

In another aspect of the invention, the first wafer is a donor wafer and the second wafer is a receiving wafer. This embodiment contemplates implanting atomic species through the oxidized surface of the first wafer prior to the treating. The atomic species are implanted through the oxidized surface of the first wafer to form a weakened zone at a predetermined depth to define a thin layer for subsequent transfer. The method further comprises bonding the donor wafer to the receiver wafer with the increased bonding energy, and supplying energy to detach the thin layer from the donor wafer at the weakened zone for transfer to the receiving wafer.

In an advantageous embodiment, the implanted atomic species comprise at least one of hydrogen and helium ions, or a co-implantation of both ions. The process may also beneficially include conducting a thermal oxidation step prior to treating the donor wafer. The resulting structure that includes the thin layer and donor wafer resulting from use of the process according to the invention is a semiconductor-on-insulator structure.

BRIEF DESCRIPTION OF THE DRAWINGS

Other advantages of the invention will become clear after reading the following detailed description with reference to the attached drawings, in which.

DETAILED DESCRIPTION OF THE PREFERRED EMBODIMENTS

The wafer cleaning process according to the invention may be used with any wafer surface that is to be molecularly bonded to another surface. This process is preferably utilized in combination with the thin layer removal method according to the SMART-CUT® process.

Figure 1A:
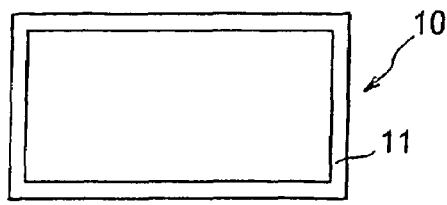
FIGS. 1a to 1d show the stages of a SMART-CUT® transfer process.

Referring to FIG. 1a, a first stage includes oxidizing a semi-conductor wafer to create a donor wafer 10 having an oxide layer 11 on its surface. This oxidation process may be native, or may be conducted under a heat treatment (i.e., thermal oxidation), or by deposit of aggregates of $SiO_2$.

Figure 1B:
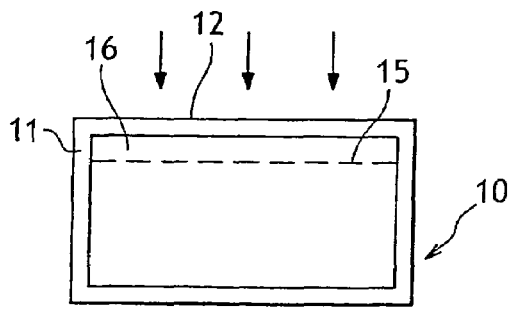

With reference to FIG. 1b, the oxidized donor wafer 10 is subjected to an implantation of atomic species through one of the oxidized surfaces. The atomic species may be hydrogen, helium ions or a co-implantation of helium and hydrogen ions. The atomic species used during implantation are dosed and are implanted with a predetermined energy to form a weakened zone 15 at a pre-set depth under the surface of the donor wafer 10. The weakened zone 15 has a particular weakness relative to the rest of the donor wafer 10. A film 16 is thus formed that is delimited by the weakened zone 15 and the oxidized surface 12.

Figure 1C:
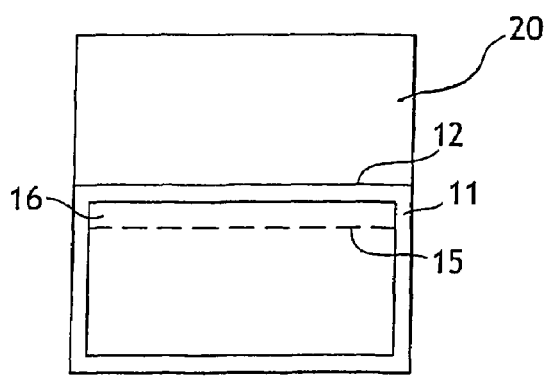

Referring to FIG. 1c, a receiver wafer 20 is brought into contact with the oxidized surface 12 through which implantation has taken place. Bonding by molecular adhesion takes place between the surfaces that are brought into contact.

An annealing stage or other heat treatment may optionally be applied to reinforce the bonding interface and enhance the bonding linkages between the two wafers. This is carried out at one or more predetermined temperatures and for a predetermined duration so that the bonding efficiency is optimal and to avoid the creation of structural defects on the wafer surface. As an example, it may be possible to use a temperature of about 300° C. for about 30 minutes. Actually, this heat treatment will cause the disappearance of a large proportion of the SiOH bonds to the advantage of the stronger covalent Si—O—Si bonds.

Next, sufficient energy, such as heat and/or mechanical energy, is supplied to break the weak bonds of the weakened zone 15. This causes detachment of the thin film 16 from the donor wafer 10, thus forming the semiconductor-on-insulator structure 30 shown in FIG. 1d. The thin film 16 removed from the donor wafer 10 forms the semiconductor part, and the subjacent oxide layer 17 forms the electrically insulating part of the structure 30.

A finishing stage may then be implemented to minimize any defects and rough patches that appeared when detaching the thin film. This finishing stage may include a treatment such as chemical etching, sacrificial oxidation, polishing, chemical mechanical polishing (CMP), atomic species bombardment or any other smoothing technique. The final structure may then be used in applications for micro-electronics, optics or optronics. For example, it would be possible to form the desired components in the detached layer.

It is thus possible to make semiconductor-on-insulator structures such as SOI, SGOI (Silicon Germanium on Insulator), SOQ (Silicon on Quartz), GeOI (Germanium On Insulator) structures, an alloy made of components belonging to the Group III-V on insulator family; each having an insulating layer including the cleaned oxide layer according to the invention introduced between the detached layer and another wafer.

As shown above, the SMART-CUT® process may be used to bond the donor wafer 10 to the receiver wafer 20, and the present invention improves upon the overall process. One goal is to improve the bonding between the two wafers 10 and 20, which can be achieved by satisfying certain objectives. First, remove isolated particles from the bonding surface of at least one of the wafers to reduce the appearance of post-bonding defects. Second; reduce surface roughness or the size and the number of the rough patches on the wafer surface to increase the contact areas of the bonding surfaces which results in improving the bonding energy. Third, make the surfaces hydrophilic. Furthermore, contaminants on the surface of at least one of the wafers to be bonded can be removed to reduce the appearance of post-bonding defects. These goals can be achieved by utilizing a simple, fast and cost-effective technique according to the invention. Another goal is to create a semiconductor-on-insulator structure 30 by using the SMART-CUT® process and incorporating a stage according to the invention.

Another purpose is to control the preparation of an oxidized surface 12 that has been subject to implantation for subsequent bonding. It has been observed that such a surface is about 5 times more sensitive to such preparation than if it had not been subject to implantation. Consequently, it is important to accurately calibrate and to correctly set preparation parameters.

The wafer to be cleaned may be made of any type of semiconductor material. However, with regard to the following discussions, the wafer material is silicon, which material has been studied as described below. In an implementation, a wafer was oxidized naturally (i.e., it has a native oxide) or artificially (e.g., it is provided with a thermally formed oxide thereon). Optionally, a preliminary step of plasma activation of at least one oxide surface to bond also may be implemented.

The invention then proposes a process for preparing a surface of the wafer for bonding with another wafer, implementing at least one chemical treatment stage that employs ammoniated chemical species mixed with molecules of $H_2O_2$. In a preferred embodiment, such chemical species are supplied in a moist medium. The chemical species are, for example, diluted in de-ionized water. An ammoniated solution of this kind is also called an SC1 solution.

Cleaning by means of an SC1 solution results in the following effects (obtained by the chemical action of this solution). The surface is etched, making it possible to dig under the particles and thus to "strip" them (otherwise known as a "lift-off" effect). An opposite electric potential between the surface and the particles is created, linked directly to the high pH of the solution which causes detachment of isolated particles. The opposite electrical potential prevents migration of particles from the bath to the plate. This cleaning is therefore linked particularly to the high pH of the ammoniated solution, including as a result a significant concentration of OH— ions in solution. During the etching of the oxide by the ammonia, these ions react with the pendant bonds generated on the surface and saturate them in SiOH termination. This layer of SiOH formed on the surface then creates the repelling opposite potential, which detaches particles bonded to the surface (in other words the isolated particles) and prevents them from resettling. These surface SiOH bonds will also be the point of insertion of water molecules on the surface of the wafer, thus causing a hydrophilic condition. This hydrophilic condition improves the bonding with another wafer.

Figure 2:
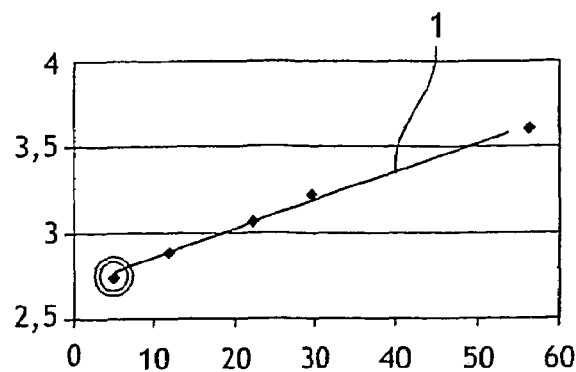
FIG. 2 is a graph showing a plot of measurements of the depths of etch in angströms to the values of rough patches in RMS angströms on wafers after different cleaning operations.

With reference to FIG. 2, the results are shown of a study conducted to find the relationship between the thickness of etched materials (etch depth) by different SC1 solutions, to the rough patches that are present and measured on the wafer surface. The etch depths were measured by reflectometry, and the rough patches were measured using an AFM (Atomic Force Microscope), on oxidized silicon wafers that are and have been subject to ion implantation.

The level of particle removal is determined by measurements taken prior to and following each SC1 treatment. Measurements were taken by reflectometry, typically by using a laser adjusted to a pre-set light spectrum, to about 0.13 microns. This value is constitutes the average diameter of the smallest particles detectable by reflectometry. The x-coordinate of the graph in FIG. 2 shows the etch depths obtained with different SC1 solutions, expressed in angströms. The y-coordinates of the graph in FIG. 2 show the values of roughness or rough patches measured on the wafer for the different etches carried out on the wafers, and these roughness or rough patch values are expressed in RMS angströms. The roughness or rough patches are presented as a function of the etches implemented on the wafer surface, and are shown on the graph by black dots.

A first result of the measurement is that the average roughness increases with the etch depth. A second result is that a roughly linear relationship was obtained between the etch depth and the roughness values.

Figure 3:
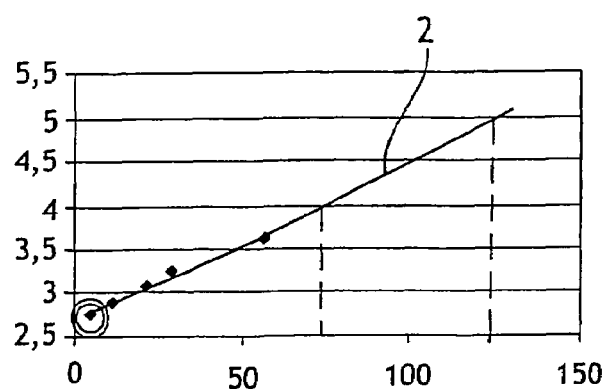
FIG. 3 is a graph showing a plot of the same measurements as those shown in FIG. 2, but used here to predict the resultant rough patches due to more substantial cleaning operations.

Referring to FIG. 3, a linear extension of the curve 1 of FIG. 2 is shown that takes the substantially linear relationship between the etch depth and the roughness values noted above into account. The result is the curve 2 shown in FIG. 3. Using this linear extension of the curve 1, and knowing that a maximum pre-set roughness value beyond which the bonding energy becomes insufficient exists, it is then possible to deduce and predict the maximum depth of etch that is associated with it, beyond which the bonding energy becomes insufficient. In an implementation, the maximum roughness value was set at about 5 Å RMS, in compliance, for example, with the results of measurements disclosed in "Detailed characterization of wafer bonding mechanisms", C. Maleville et al., published by Electromechanical Society Proceedings, volume 97-36, page 50, section 3. It has been shown that for a roughness value above about 5 Å RMS the bonding energy may be drastically reduced. Consequently, with reference to FIG. 3, it may be deduced that the maximum etch depth is around 120 Å.

Wafer bonding, when applied to making an SOI structure by using the SMART-CUT® technique, requires a bond strength that is sufficient, and in particular much greater, than the implantation force of the buried (having been implanted) atomic species. This is achieved experimentally with regard to roughness or rough patches of less than about 4 Å RMS, thus reducing (again with reference to FIG. 3) the maximum etch depth to around 60 to 70 Å. These measurements underscore the need to restrict as far as possible the etching action on the wafer surface, with a maximum limit on the etch depth that must not be exceeded.

Figure 4:
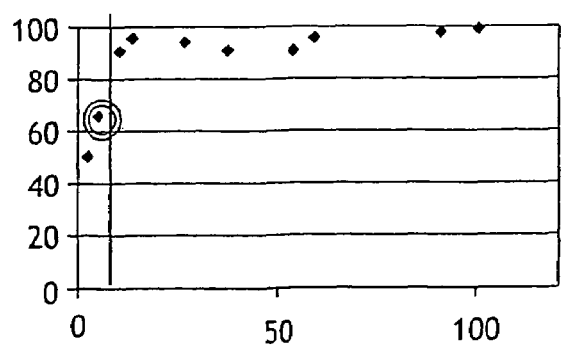
FIG. 4 is a graph showing a plot of measurements of the effectiveness of surface particle removal from a wafer as a function of the depths of etch caused by the cleaning.

FIG. 4 depicts another study undertaken to find relationships between the efficiency of surface particle removal from the wafer, and the etch depth of the wafer when using different SC1 solutions. When these measurements were taken, the wafers were deliberately contaminated by depositing a preset number of isolated particles, which represented the particles to be removed. The efficiency of removal of these particles was measured by taking LPD (Light Point Defect) measurements on the surfaces of different wafers that had been deliberately contaminated in a similar manner. An LPD is a defect that is detectable by laser light scattering optical measurements. An LPD defect is also known as a "highlight".

An LPD measurement is made by illuminating the wafer surface using an incident optical wave emitted by the laser source. The light scattered by the LPD defects present on the surface is detected by means of an optical detector. The light scattering on the wafer surface can be correlated with the number of residual particles on the wafer surface, and thus light scattering measurements provide information on the number of residual particles. Other residual particle measurement techniques may be implemented, alone or in combination with the LPD measurements.

Etch depth is typically measured by using reflectometry, in substantially the same way as that used to measure the rough patches as explained above with reference to FIG. 2. The x-coordinate of FIG. 4, in the same way as that for FIGS. 2 and 3, shows the different etch depths provided by different SC1 solutions, expressed in angstroms. The y-coordinate shows isolated particle removal efficiencies, expressed as a percentage relative to the estimated total number of present isolated particles on the wafer surface. Particle removal efficiency measurements as a function of the etch depths are shown on the graph as black dots.

FIG. 4 illustrates that beyond an etch depth of about 10 Å, particle removal efficiency is close to 100%. In contrast, below the value of about 10 Å, particle removal is much less impressive, having an efficiency of around 50% to 60%. Thus, for etches of less than about 10 Å, particle removal is insufficient for allowing good bonding conditions. This means that if the etched thickness is too small, the particles are no longer separated from the surface and their removal efficiency falls very quickly.

Optionally, it is possible to simultaneously use an SC1 bath and to apply ultrasonic waves to help separate the particles from the surface. This technique is less preferred due to the additional cost of equipment and complication of the process.

It is noted again, that an oxidized surface that has been subject to implantation is particularly sensitive to chemical treatments. This sensitivity is about 5 times greater than that of the same type of surface that has not been subject to implantation. Thus, the implementation and the calibration of the chemical treatment must be carefully conducted.

The measurements discussed above with reference to FIGS. 2 and 4 make it possible to evaluate the desired etch depth when the wafer to be cleaned will be brought into the presence of an SC1 solution. The etch depth is bound to be located in the range between about 10 Å and about 120 Å, or between about 10 Å and about 60 Å in an embodiment using an SOI structure formed by using the SMART-CUT® technique. Within this authorized range of etch depths, a considerable number of experiments were conducted to attempt to optimize etch conditions using SC1 solutions, with a view to further increasing the post-cleaning bonding energy. These etch results typically employed a dosing per unit mass of $NH_4OH/H_2O_2$ in the range from about 1/2 to about 4/4 (or 1/1) and preferably from about 1/2.5 to 1/1 (all references to unit mass of $NH_4OH$ correspond to $NH_4OH$ diluted at a ratio of about 30% in water), with temperatures in the range of from about 30° C. to about 80° C., and etch durations of from about a few seconds to several hours. Generally, the parameters are chosen so that the cleaning duration is relatively short, on the order of between about 1 and 6 minutes.

The following Table 1 lists some conditions wherein cleaning by using SC1 proved to be particularly impressive:

TABLE 1

| SC1 | % per unit mass $NH_4OH/H_2O_2$ | T(° C.) | Cleaning time |
| --- | --- | --- | --- |
|  | ½ | 50 | 3 min |
|  | 2/4 (or ½) | 70 | 3 min |
|  | ¾ | 80 | 3 min |

In particular, if a % per unit mass $NH_4OH/H_2O_2$ equal to approximately ½ is used at a temperature of about 70° C., and with a cleaning time of about 3 minutes, then an etch of about 20 Å was obtained. This resulted in a roughness value of about 3 RMS Å, and a level of particle removal of more than about 90%, thus attaining an optimum bonding energy.

Optionally, one or more cleaning stages may precede or follow the previous cleaning stage. In this manner, an SC2 treatment is advantageously implemented subsequent to the SC1 treatment. The SC2 treatment may be conducted with a solution comprising a mix of HCl and of $H_2O_2$. This treatment is typically applied at temperatures of between about 70° C. and about 80° C. The action of the SC2 solution makes it possible to remove mainly metal contaminants from the wafer surface.

The prior use of a chemical treatment at a basic pH, such as a treatment employing an ammoniacal chemical species during the SC1-type treatment, for example, greatly improves the hydrophilicity of the wafer surface. The high concentration of hydroxide ions in solution will indeed allow these OH— ions to react with pendent bonds generated on the surface of the wafer and to saturate them with SiOH terminations. Such superficial SiOH bonds will then constitute the adsorption position of molecules of water on the wafer surface, thus causing hydrophilization which improves bonding with another wafer. Further, the SiOH layer formed on the surface will create an opposing repulsive potential which can remove the least bonded particles (i.e., isolated particles) from the surface and prevent them from being re-deposited. Thus, a basic solution employed on the surface will both remove undesirable particles (by preventing them from re-depositing) and increase the adhesive potential of the wafer with another wafer.

The hydrophilic or hydrophilized surface then undergoes a chemical treatment using hydrochloric acid chemical species (HCl). In a first embodiment of this second step of the method of the invention, the chemical species are supplied by a wet procedure. In this case, the chemical species can be diluted in deionized water, for example. Such a hydrochloric acid solution is then termed a SC2 solution. In a second embodiment of the method of the invention, the chemical species are supplied by a dry procedure.

Figure 5:
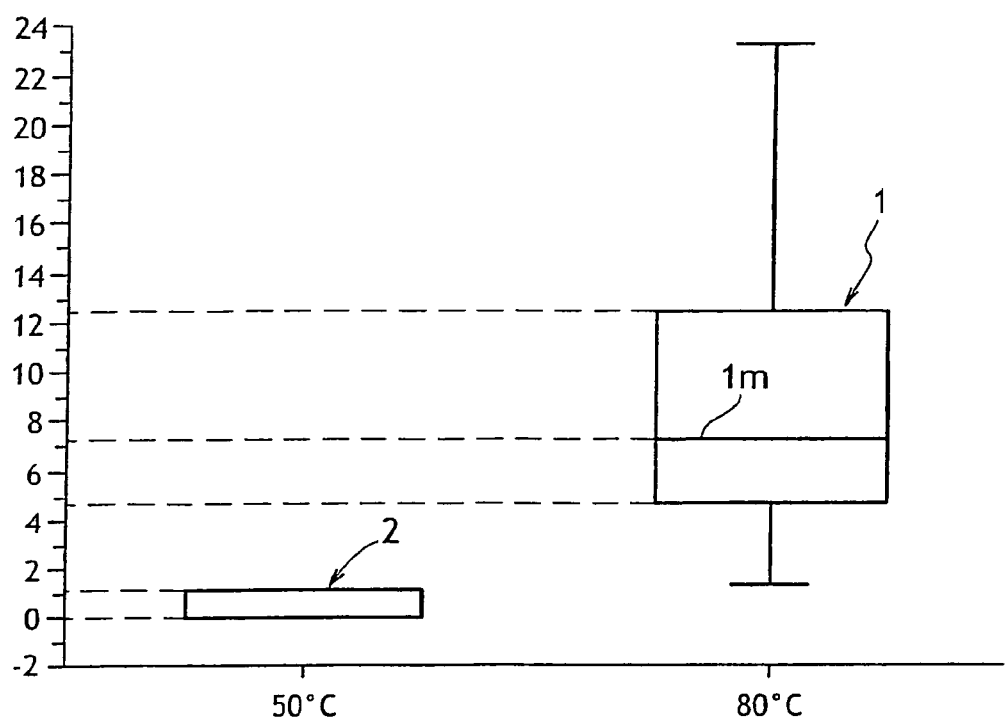
FIG. 5 is a graph showing a plot of measurements of the number of blisters observed on wafers obtained after removal using a SMART-CUT® method, in which prior to bonding, a SC2 treatment has been carried out at a temperature of 50° C. or a SC2 treatment has been carried out at a temperature of 80° C., after a SC1 treatment according to the invention.

Tests have been conducted to attempt to optimize the cleaning temperature to achieve a maximum bonding energy. In particular, tests have been conducted to observe the impact of temperature during hydrochloric acid treatment on bonding energy. FIG. 5 shows the number of blisters (already discussed) which appeared on substantially identical SOI structures produced by a SMART-CUT® layer transfer process, each formed from monocrystalline silicon covered with an oxide layer of about 1500 Å thick, whereby the chemical treatment prior to bonding, employing hydrochloric acid species, had been carried out at a temperature of 50° C. or 80° C. The number of blisters is shown up the ordinate which the temperature is shown along the abscissa. The overall results of the set of measurements carried out on a sample of SOI structures obtained after the SMART-CUT® process and which had undergone hydrochloric acid treatment at 80° C. produced a mean number of blisters of about 7. In comparison, the overall results of the measurements carried out on a sample of structures obtained following a SMART-CUT® process and which had undergone a hydrochloric acid treatment at 50° C. gave a mean number of blisters of about 0.5. This shows that the use of hydrochloric acid species during cleaning prior to bonding increases the bonding energy when carried out at 50° C. rather than at 80° C.

The explanation which can be provided for the influence of temperature on the reduction in the number of surface blisters (and thus the increase in bonding energy) lies in the deleterious effect of the chemical action of HCl on surface hydrophilicity. Hydrochloric acid has an acidic pH (of about 2) and thus comprises a high concentration of $H_3O^+$ ions in solution. Those ions will thus interact with water on the surface of the wafer and with the surface SiOH terminations, reducing the number of the latter. The reduction in those bonds then tends to reduce the number of bonding sites and the quality of the surface wafer, degrading the hydrophilic character of the surface.

Better hydrophilicity of the surfaces to be bonded results in a higher bonding energy between the wafers, and this would seal the particles imprisoned at the surface more strongly and close the micro-defects around them. This avoids the origin of blisters so that, upon detachment, there would be fewer pressurized cavities that could deform the surface to form blisters therein. Thus, a reduction in temperature would reduce the deleterious effect of hydrochloric acid on the hydrophilicity of the bonding surfaces and thus not reduce the bonding energy by too great an extent. The data shows that a temperature of 50° C. during hydrochloric acid treatment will increase the bonding energy by about 30% with respect to the conventionally implemented hydrochloric acid treatment typically conducted done at 80° C. or more for the same duration of treatment.

Another advantage of the present invention is that reducing the temperature to below 50° C. during the hydrochloric acid treatment increases the bonding energy when the treatment time is less than about 10 minutes, and is preferably about 3 minutes. However, it has been previously explained that a major purpose of carrying out a hydrochloric acid treatment such as a SC2 treatment is to decontaminate the surface to be bonded, and that the efficiency of contaminant removal (primarily metals) changes from about 95% to about 99% depending on whether the temperature is in the range of from ambient temperature to about 90° C. respectively, Furthermore, the depth of action is directly linked to the diffusion length of chlorine ions into the oxide at the treatment temperature, and this can vary from about 1 Å to about 10 Å between ambient temperature and about 90° C. It was also found that decontamination has to be particularly addressed in the case of a plasma activation step previously processed (as previously described) as plasma activation tends to contaminate the surface.

Thus it has been found that to preserve a sufficient hydrophilicity (obtained from previous SC1 treatment) of the surface to be bonded for good bonding quality, the temperature during the hydrochloric acid treatment should be reduced, and that to decontaminate the bonding surface sufficiently, the temperature should be increased during that hydrochloric acid treatment. This requires a compromise between hydrophilicity and metal decontamination. To this purpose, the temperature can be adapted to maximize the bonding energy.

After cleaning at least one of the two oxidized bonding surfaces of the two wafers that are to be bonded, the wafers are brought into close contact with each other. Oxidized wafer cleaning thus makes it possible to restrict a sizeable number of large-size particles and to avoid defects that would result in a downgrade of the wafers. Wafers are downgraded when the bonding energy is not sufficient to obtain non-defective final structures. The two wafers 10 and 20 (see FIG. 1c) are advantageously brought into contact just after cleaning, without any intermediate treatment stage. The two wafers can be bonded by adhesion of the molecules present on their bonding surfaces. This adhesive property is explained mainly by the hydrophilic properties present on the wafer surface. In particular, water molecules are present on the wafer surface which give rise to Si—OH bonds and to water diffusion in the vicinity of the wafer surfaces. The Si—OH bonds of a wafer bonding surface are linked via hydrogen bonds to the surface of the other wafer, thus forming a bond strength between the two wafers 10 and 20 that is sufficiently significant to create a sufficient binding adhesion. It is then advantageous to apply a heat treatment to increase the bonds between the two wafers 10 and 20. This heat treatment may be applied at one or more pre-set temperatures and for a pre-set period of time to optimize the bonding efficiency and to avoid creating structural defects on the wafer surface. The heat treatment causes the disappearance of a large part of the Si—OH bonds to the benefit of the covalent Si—O—Si (stronger) bonds.

Figure 1D:
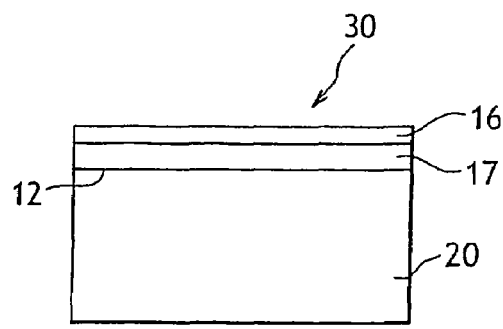

With reference to the FIGS. 1c and 1d, after bonding of two wafers, a thin film 16 is detached at the level of a weakened zone 15 to form the structure 30. The detachment step may be imperfect if, for example, non-transferred areas appear that result from the presence of intervening particles at the bonding interface that were imprisoned during bonding. These apparent defects may be accentuated or created during a subsequent heat treatment such as a heat treatment to solidify the bonding interface. Such defects are reduced as much as possible by the cleaning stage according to the invention, which is implemented prior to the bonding step. The SC1 chemical treatment is carried out under conditions and in accordance with treatment parameters chosen to maximally reduce the number of isolated particles at the bonding interface, while reducing interfacial roughness or rough patches as much as possible. The SC1 treatment also takes into account the particular etching sensitivity of an oxidized surface that has been subject to implantation. Then, the SC2 treatment is implemented such that metallic contaminants are efficiently removed while retaining the hydrophily obtained with SC1 treatment for a better bonding of the cleaned surface.

The present invention relates to preparing the surface of oxidized wafers of any kind of material relating to the field of semi-conductors. Thus, any material belonging to atomic Group IV family such as silicon or a Silicon-Germanium alloy, and extending also to other types of alloys of the Group IV-IV, Group III-V or Group II-VI family. It should also be understood that these alloys may be binary, ternary, quaternary or of higher degree.

What is claimed is:

1. A method for preparing a oxidized surface of a first wafer for enhanced molecular bonding with a second wafer, which comprises treating the oxidized surface of the first wafer with a solution of $NH_4OH/H_2O_2$ at treatment parameters sufficient to etch about 10 Å to about 120 Å from the wafer surface, followed by treating the etched surface with hydrochloric acid species at a temperature below about 50° C. for a duration of less than about 10 minutes to remove isolated particles from the oxidized surface without increasing roughness or creating rough patches thereon to provide a cleaned surface capable of providing an increased bonding energy between the first and second wafers when those surfaces are bonded together compared to bonding of those surfaces without such treating of the oxidized surface of the first wafer.

2. The method of claim 1, wherein the treatment parameters include at least one of a predetermined dose of chemical elements, a predetermined temperature, or a predetermined duration for applying the treatment.

3. The method of claim 1, wherein the treatment parameters are chosen such that treating removes isolated surface particles having an average diameter of more than about 0.1 micrometers.

4. The method of claim 1, wherein the treatment parameters are chosen such that after treatment any roughness or rough patches that appear are less than about 5 Å RMS.

5. The method of claim 1, wherein the treating is conducted to etch the first wafer surface to a depth of about 10 Å to about 60 Å.

6. The method of claim 1, which further comprises conducting plasma activation of the first wafer surface prior to the treating with the $NH_4OH/H_2O_2$ solution.

7. The method of claim 1, wherein the surface of the second wafer is treated in the same manner as that of the first wafer to provide a further increase of the bonding energy between the first and second wafers when those surfaces are bonded together.

8. The method of claim 1, which further comprises implanting atomic species through the oxidized surface of the first wafer prior to the treating.

9. The method of claim 8, wherein the first wafer is a donor wafer, the second wafer is a receiving wafer, and the atomic species are implanted through the oxidized surface of the first wafer to form a weakened zone at a predetermined depth to define a thin layer for subsequent transfer; and the method further comprises bonding the donor wafer to the receiver wafer with the increased bonding energy, and supplying energy to detach the thin layer from the donor wafer at the weakened zone for transfer to the receiving wafer.

10. The method of claim 9, wherein the implanted atomic species comprise at least one of hydrogen and helium ions or a co-implantation of both ions.

11. The method of claim 10, further comprising conducting a thermal oxidation step to form the oxidized surface of the donor wafer prior to treating the donor wafer.

12. The method of claim 10, wherein the thin layer and donor wafer comprise a semiconductor-on-insulator structure.

13. The method of claim 1, wherein the treatment parameters provide a dose per unit mass of $NH_4OH/H_2O_2$ in the range from about 1/2.5 to about 1/1.

14. The method of claim 13, wherein the treatment parameters include a temperature of between about 30° C. and about 90° C. and a duration of between about 1 and 6 minutes.

15. The method of claim 14, wherein the treatment parameters include a dose per unit mass of $NH_4OH/H_2O_2$ of about 1/2.5 to about 1/2, a temperature of about 50° C., and a duration of about 3 minutes.

16. The method of claim 14, wherein the treatment parameters include a dose per unit mass of $NH_4OH/H_2O_2$ of about 1/2.5 to 1/2, a temperature of about 70° C., and duration of about 3 minutes.

17. The method of claim 14, wherein the treatment parameters include a dose per unit mass of $NH_4OH/H_2O_2$ of about 3/4, a temperature of about 80° C., and a duration of about 3 minutes.

18. The method of claim 17, wherein the hydrochloric acid treating is conducted in a wet or dry manner and is carried out to remove about 95% to 99% of metallic contaminants from the wafer surface.

19. The method of claim 18, wherein the hydrochloric acid species is applied to the wafer surface at a temperature that is no greater than about room temperature.

20. The method of claim 19, wherein the hydrochloric acid species is applied to the wafer surface at a temperature that is greater than about 0° C.

* * * * *